(12) United States Patent
Lee (10) Patent No.: US 9,935,146 B1
(45) Date of Patent: Apr. 3, 2018

(54) PHASE DETECTION PIXELS WITH OPTICAL STRUCTURES

(71) Applicant: SEMICONDUCTOR COMPONENTS INDUSTRIES, LLC, Phoenix, AZ (US)

(72) Inventor: Byounghee Lee, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/383,430

(22) Filed: Dec. 19, 2016

(51) Int. Cl.
*H01L 31/062* (2012.01)
*H01L 27/146* (2006.01)

(52) U.S. Cl.
CPC .. *H01L 27/14627* (2013.01); *H01L 27/14621* (2013.01); *H01L 27/14629* (2013.01); *H01L 27/14645* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 2006/0054946 A1 | 3/2006 | Baek et al. | |
| 2006/0151818 A1* | 7/2006 | Toumiya | H01L 27/14627 257/294 |
| 2008/0164552 A1 | 7/2008 | Hwang | |
| 2015/0364511 A1* | 12/2015 | Echizen | H01L 27/14643 257/432 |
| 2016/0269662 A1 | 9/2016 | Hepper et al. | |
| 2017/0278887 A1* | 9/2017 | Han | H01L 27/14627 |

* cited by examiner

*Primary Examiner* — Minh-Loan Tran
(74) *Attorney, Agent, or Firm* — Treyz Law Group, P.C.; Joseph F. Guihan (57) ABSTRACT

In order to increase angular response or otherwise customize the response of phase detection pixels to incident light, phase detection pixels may include optical structures. The optical structures may be formed between a microlens and at least first and second photodiodes to redirect incident light between the microlens and the photodiodes. The optical structures may include two or more layers with different indices of refraction. For example, a layer of silicon dioxide and a layer of silicon nitride may form a concave lens that increases the angular response of phase detection pixels. The optical structures may have any desired shape to customize the response of the photodiodes to incident light.

19 Claims, 12 Drawing Sheets

PHASE DETECTION PIXELS WITH OPTICAL STRUCTURES

BACKGROUND

This relates generally to imaging systems and, more particularly, to imaging systems with phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Yet another arrangement for electronic devices to identify distances includes using phase detection pixels. However, the asymmetric angular response of conventional phase detection pixels may be limited.

It would therefore be desirable to be able to provide improved phase detection pixel arrangements for image sensors.

DETAILED DESCRIPTION

Figure 1:
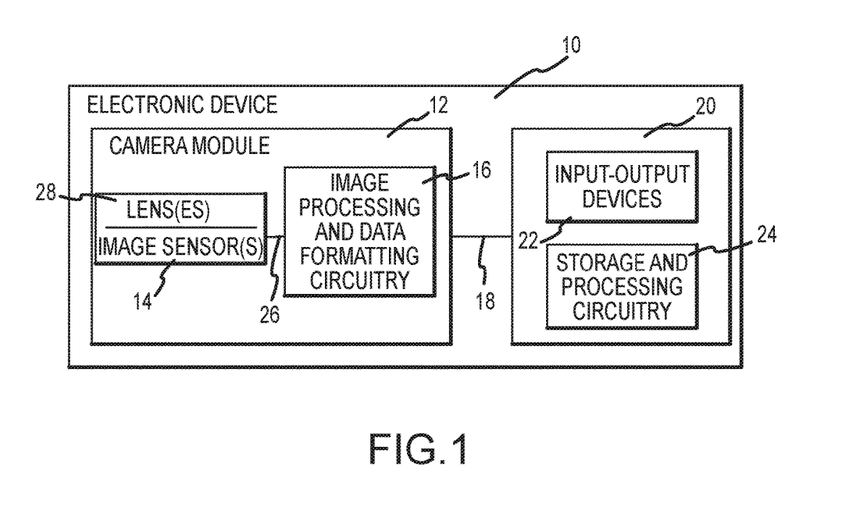
FIG. 1 is a schematic diagram of an illustrative electronic device with an image sensor that may include phase detection pixels in accordance with an embodiment of the present invention.

Embodiments of the present invention relate to image sensors with automatic focusing and depth sensing capabilities. An electronic device with a camera module is shown in FIG. 1. Electronic device 10 may be a digital camera, a computer, a cellular telephone, a medical device, or other electronic device. Camera module 12 (sometimes referred to as an imaging device) may include one or more image sensors 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as pixel pair 100 shown in FIG. 2A.

Figure 2A:
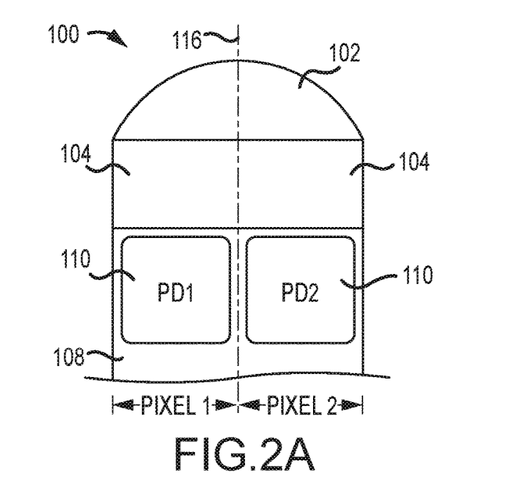
FIG. 2A is a cross-sectional view of illustrative phase detection pixels having photosensitive regions with different and asymmetric angular responses in accordance with an embodiment of the present invention.

FIG. 2A is an illustrative cross-sectional view of pixel pair 100. Pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. Microlens 102 may have a width and a length, with the length being longer than the width. Microlens 102 may have a length that is about twice as long as its width. Microlens 102 may be in the shape of an ellipse with an aspect ratio of about 2:1. In other embodiments, microlens 102 may be another shape such as a rectangle or another desired shape. Microlens 102 may have an aspect ratio of less than 2:1, 2:1, greater than 2:1, greater than 3:1, or any other desired aspect ratio.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figure 2B:
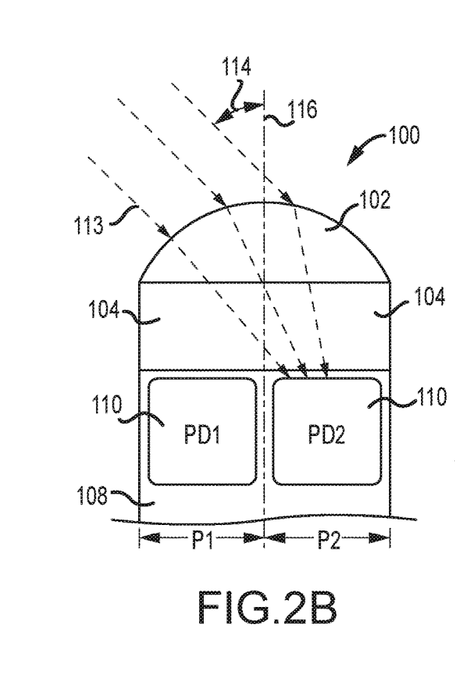
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
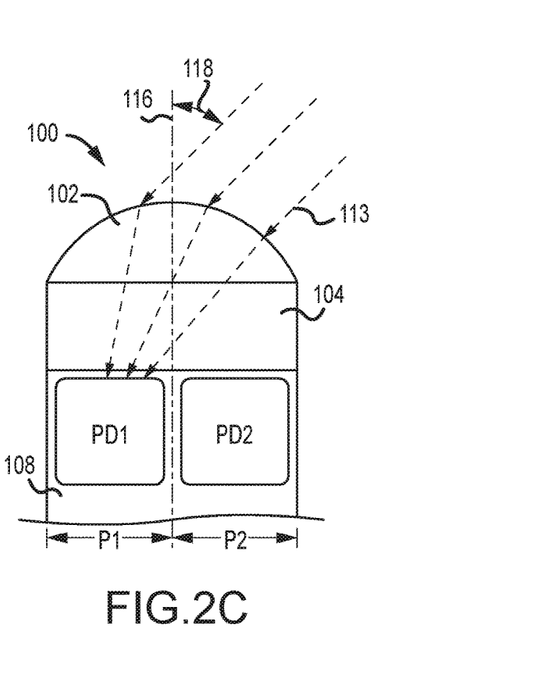

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
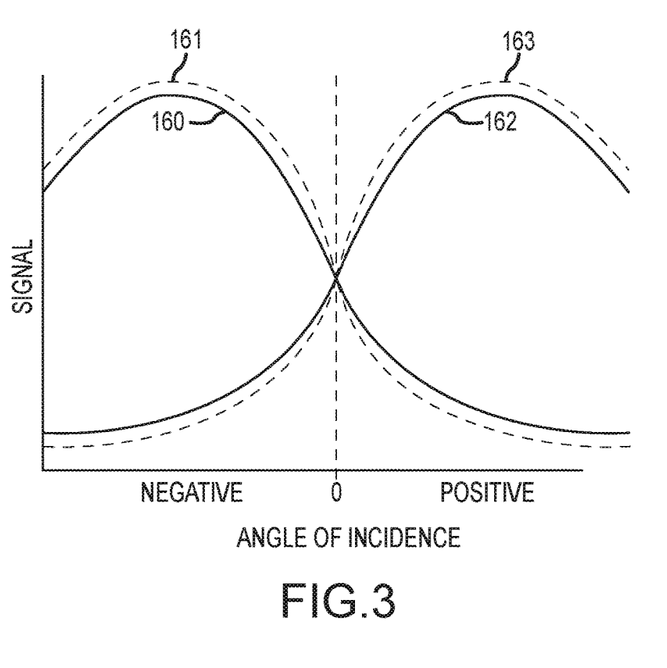
FIG. 3 is a diagram of illustrative signal outputs of phase detection pixels for incident light striking the phase detection pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in camera module 12 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

In some scenarios, it may be advantageous to increase the asymmetric angular response of PD1 and PD2. Lines 161 and 163 may represent the output image signal for photodiode PD2 and PD1, respectively, for photodiodes with increased angular response compared to lines 160 and 162. As shown in FIG. 3, the difference between lines 161 and 163 is greater than the difference between lines 160 and 162. The photodiodes associated with lines 161 and 163 may therefore generate phase detection data with a higher sensitivity than the photodiodes associated with lines 160 and 162. In general, an increased asymmetric angular response in PD1 and PD2 will improve the quality of the phase detection data generated. One way to increase the asymmetric angular response in PD1 and PD2 is to include optical structures between the microlenses and photodiodes of phase detection pixels. The optical structures may be able to redirect incoming light to increase asymmetric angular response. Optical structures may additionally be included in phase detection pixels for other purposes. In general, optical structures may be included between the microlens and photodiodes of a phase detection pixel to control the path of incident light between the microlens and the photodiodes.

Figure 4:
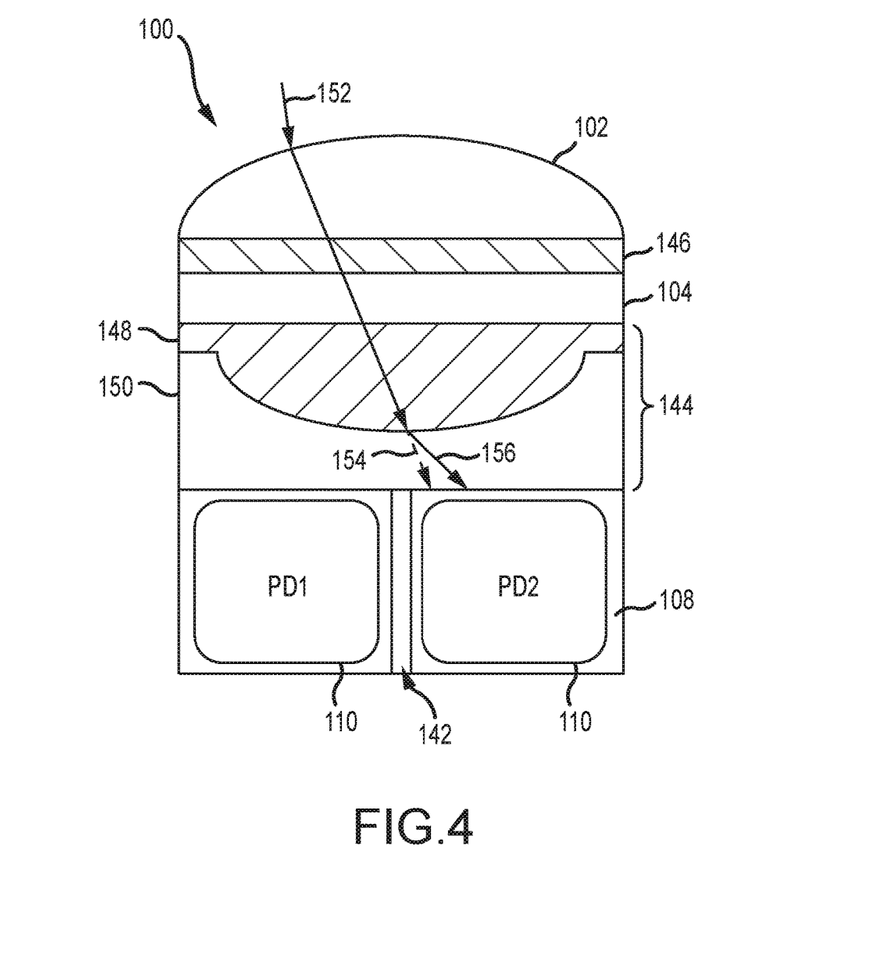
FIG. 4 is a cross-sectional side view of an illustrative phase detection pixel pair with optical structures in the form of a concave lens in accordance with an embodiment of the present invention.

FIG. 4 is a cross-sectional side view of an illustrative phase detection pixel pair 100. As shown, pixel pair 100 may include first and second photosensitive regions 110 (PD1 and PD2) formed under microlens 102. Photosensitive regions 110 may be formed in silicon substrate 108. Photosensitive regions 110 may be formed from doped silicon and may be separated by isolation region 142. Isolation regions 142 may be formed from doped silicon or may be deep trench isolation, as examples. Color filter layer 104 may be formed beneath microlens 102. Planarization layer 146 may be interposed between the color filter layer and the microlens.

To increase the asymmetric angular response of phase detection pixel pair 100 (or otherwise customize the response of PD1 and PD2 to incident light), pixel pair 100 may include optical structures 144. Optical structures 144 may be interposed between color filter layer 104 and substrate 108. Incident light must therefore pass through optical structures 144 to reach photodiodes PD1 and PD2. In addition to enhancing the angular response of photodiodes PD1 and PD2, optical structures 144 may improve the sensitivity, signal-to-noise ratio, and dynamic range of the phase detection pixel pair.

Optical structures 144 may redirect incident light before the incident light reaches the underlying photodiodes. Optical structures 144 may be formed from a variety of materials. In one illustrative embodiment, optical structures 144 may include layers 148 and 150. Layer 148 may have a relatively low index of refraction and may sometimes be referred to as a low index of refraction layer, a dielectric layer, or an optical layer. Layer 150 may have a relatively high index of refraction and may sometimes be referred to as a high index of refraction layer, a dielectric layer, or an optical layer. As shown in FIG. 4, optical layers 148 and 150 may form a concave lens to redirect light.

Incident light 152 may pass through microlens 102 towards PD2. Without the presence of optical structures 144, the incident light may proceed in direction 154. However, when optical structures 144 are present, the incident light may be redirected in direction 156. This example demonstrates how optical structures 144 may help further separate light between photodiodes PD1 and PD2. By including the concave lens formed by dielectric layers 148 and 150, there will be more separation of angled incident light between PD1 and PD2. This increases the asymmetric angular response of phase detection pixel pair 100 and may improve the phase detection pixel performance of the phase detection pixel pair.

To form a concave lens, layers 148 and 150 may have different indices of refraction. Layer 148 may have a smaller index of refraction than layer 150. For example, layer 148 may have an index of refraction of approximately 1.45, approximately 1.5, between 1.4 and 1.5, less than 1.6, less than 1.7, between 1.3 and 1.6, between 1.4 and 1.6, between 1.45 and 1.55, between 1.0 and 1.6, or any other desired index of refraction. Layer 150 may have an index of refraction of approximately 1.9, between 1.85 and 1.95, greater than 1.6, greater than 1.7, greater than 1.8, between 1.8 and 2.0, between 1.7 and 2.0, between 1.5 and 2.0, between 1.8 and 2.5, between 1.7 and 2.5, between 1.5 and 2.5, or any other desired index of refraction. The difference in indices of refraction of the optical layers may cause incident light to be refracted when passing from layer 148 to layer 150.

Layer 148 may be formed from any desired material. For example, layer 148 may be formed from silicon dioxide ($SiO_2$) or another material with an index of refraction lower than the index of refraction of layer 150. Similarly, Layer 150 may be formed from any desired material. For example, layer 150 may be formed from silicon nitride (SiN) or another material with an index of refraction higher than the index of refraction of layer 148. If desired, dielectric layer 148 may be formed from the same material has planarization layer 146. For example, dielectric layer 148 and planarization layer 146 may both be formed from silicon dioxide.

The difference of indices of refraction between layers 148 and 150 may be any desired difference. For example, the difference in refractive index may be greater than 0.1, greater than 0.2, greater than 0.3, greater than 0.4, greater than 0.5, less than 1.0, less than 0.7, less than 0.5, less than 0.3, between 0.3 and 0.6, between 0.3 and 0.7, between 0.2 and 1.0, between 0.05 and 1.0, between 0.1 and 0.5, between 0.4 and 0.7, or any other desired difference. There may be a tradeoff between the difference of refractive index between layers 148 and 150 and the shape of the interface between layers 148 and 150. Generally, the greater the difference of refractive index between layers 148 and 150, the greater the angle of refraction will be when incident light passes from layer 148 to layer 150. In the example of layers 148 and 150 forming a concave lens (i.e., when layers 148 and 150 have a curved interface that curves towards the underlying photodiodes), the degree of curvature of the concave lens may be inversely proportional to the difference in refractive index between the layers. If the difference in refractive index is low, the curved interface will need to have a high degree of curvature to redirect light the desired amount. If the difference in refractive index is high, the curved surface will not need to be as curved to achieve the same amount of light refraction.

Color filter layer 104, planarization layer 146, and microlens 102 may have any desired index of refraction (e.g., approximately 1.45, approximately 1.5, between 1.4 and 1.5, less than 1.6, less than 1.7, between 1.3 and 1.6, between 1.4 and 1.6, between 1.45 and 1.55, between 1.0 and 1.6, greater than 1.2, etc.). Layer 148 may be formed underneath and in direct contact with color filter layer 104. Layer 150 may be formed underneath and in direct contact with layer 148. Layers 148 and 150 may be said to have an interlocking shape. Layer 148 may have a portion that protrudes into a recessed portion of layer 150. There may be no intervening layers formed between layers 148 and 150.

The example of FIG. 4 in which layers 148 and 150 form a concave lens is merely illustrative. If desired, the interface between layers 148 and 150 may have another shape instead of a concave curved interface.

Figure 5:
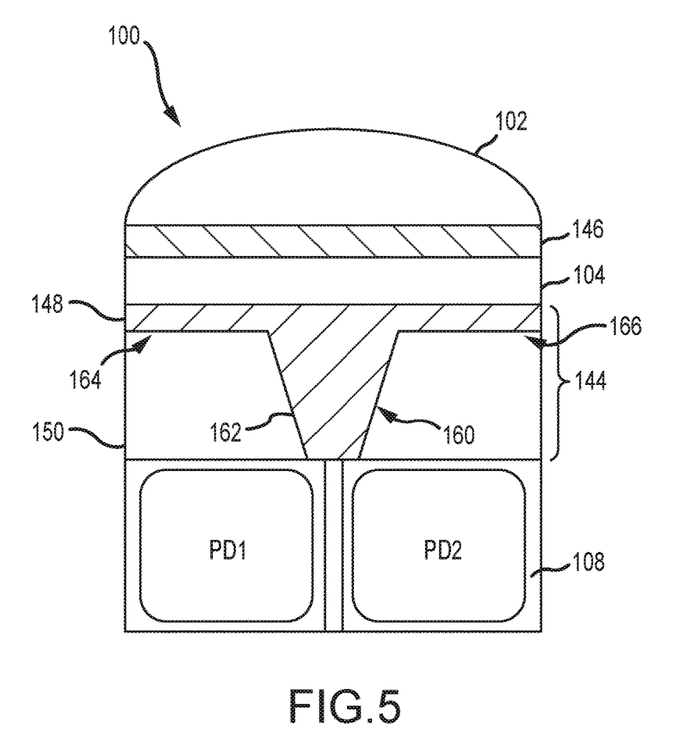
FIGS. 5 and 6 are cross-sectional side views of illustrative phase detection pixel pairs with optical structures having different shapes than the optical structures of FIG. 4 in accordance with an embodiment of the present invention.
Figure 6:
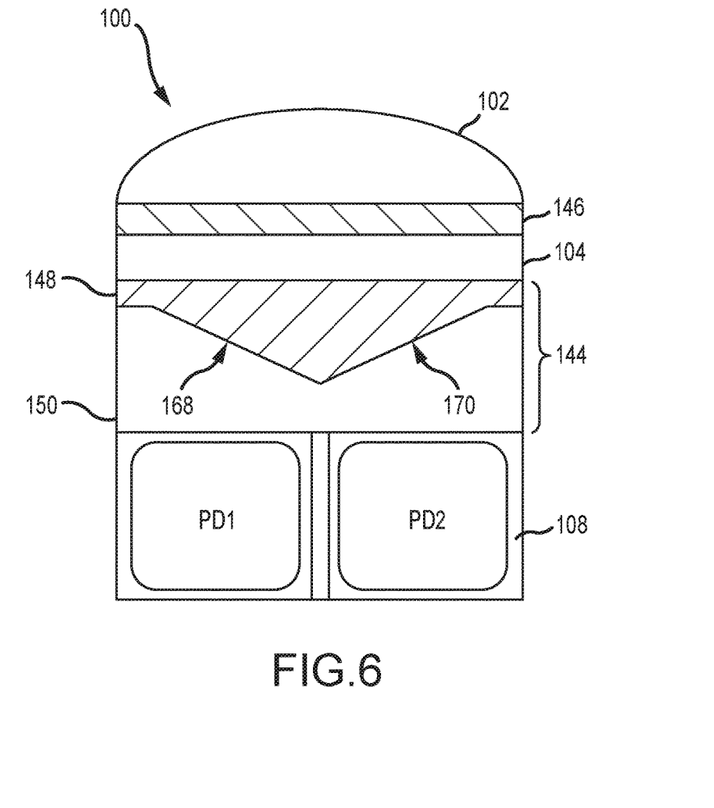
Figure 7:
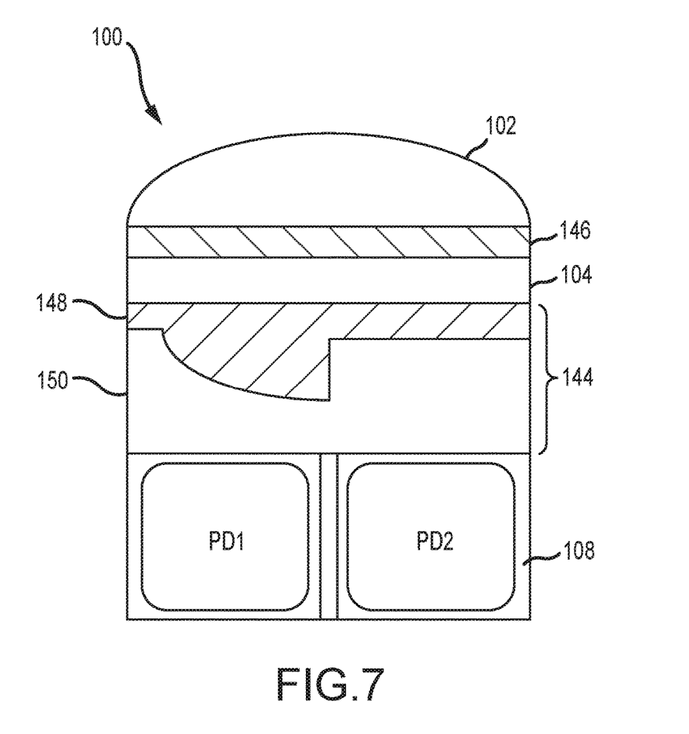
FIG. 7 is a cross-sectional side view of an illustrative phase detection pixel pair with asymmetric optical structures in accordance with an embodiment of the present invention.

FIGS. 5-7 are cross-sectional side views of phase detection pixel pair 100 with different shaped interfaces between optical layers 148 and 150. FIG. 5 shows an example where the interface of 148 and 150 may be said to have the shape of a pillar or cone. Surfaces 160 and 162 may at least partially define the shape of optical layer 148. Surfaces 160 and 162 may extend all the way to the upper surface of substrate 108 or may only partially extend to the upper surface of substrate 108 (such that at least some of layer 150 is interposed between layer 148 and substrate 108 across the entire width of layer 148). Surfaces 160 and 162 may be coupled to surfaces 164 and 166. Surfaces 164 and 166 may be parallel to each other and parallel to the upper surface of substrate 108. Surfaces 160 and 162 may be parallel to each other and perpendicular to the upper surface of substrate 108 if desired. Alternatively, as shown in FIG. 5, surfaces 160 and 162 may be positioned at an angle relative to the upper surface of substrate 108.

If desired, the interface between layers 148 and 150 may be a single planar surface that extends across the entire pixel pair. For example, layer 148 may have first and second opposing surfaces with both surfaces parallel to the upper surface of substrate 108. Layer 150 may also have first and second opposing surfaces with both surfaces parallel to the upper surface of substrate 108. The first surface of layer 150 may directly contact the upper surface of substrate 108 and the second surface of layer 150 may directly contact the first surface of layer 148.

In FIG. 6, the interface of layers 148 and 150 may be said to have a triangular shape. Layers 148 and 150 may have surfaces 168 and 170 which are at an angle relative to the upper surface of substrate 108. Surfaces 168 and 170 may meet to define a triangular shaped interface.

If desired, layer 148 may extend to the upper surface of substrate 108 such that layer 148 separates layer 150 into a first portion that covers PD1 and a second portion that covers PD2 by layer 148. In other words, surfaces 168 and 170 do not have to intersect in layer 150. Instead, surfaces 168 and 170 can meet the upper surface of substrate 108 such that layer 148 extends from the lower surface of color filter layer 104 to the upper surface of substrate 108.

In the examples of FIGS. 4-6, layers 148 and 150 have a symmetrical shape (i.e., the portions of layers 148 and 150 covering PD1 are symmetrical with the portions of layers 148 and 150 covering PD2). However, these examples are merely illustrative. If desired, layers 148 and 150 may be asymmetric as shown in FIG. 7. As shown in FIG. 7, the portions of layers 148 and 150 over PD1 may have a similar curved shape as the layers in FIG. 4. However, the portions of layers 148 and 150 over PD2 have a different shape without a curved interface.

In general, the exact structure of layers 148 and 150 may be designed to fit the particular application of the phase detection pixels. If it is desired to increase asymmetric angular response, optical structures of the type shown in FIGS. 4-6 may be used for the phase detection pixel. If it is desired to selectively alter the response of only one photodiode in the phase detection pixel pair, asymmetric optical structures may be used. Optical structures of any desired structure may be used to achieve any desired modification of a photodiode's response to incident light.

Figure 8:
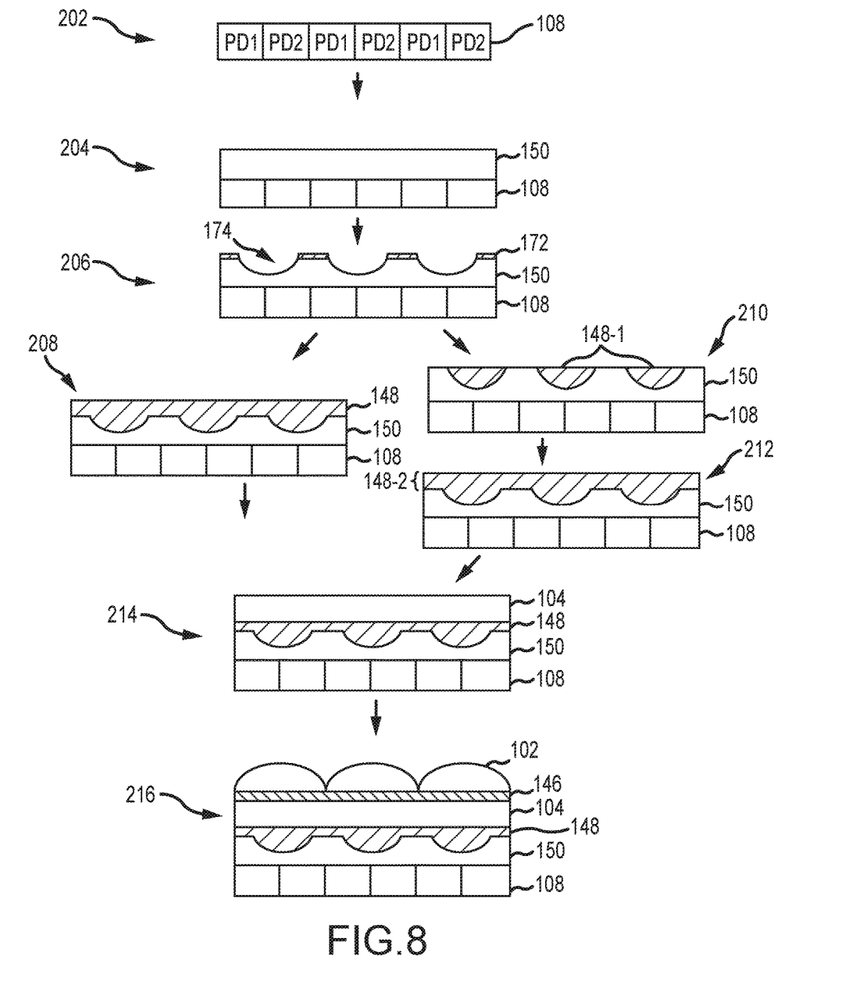
FIG. 8 is a cross-sectional side view of illustrative steps for forming phase detection pixels with optical structures in accordance with an embodiment of the present invention.

FIG. 8 is a cross-sectional view of illustrative steps for forming optical structures in phase detection pixels. At step 202, substrate 108 with a plurality of photosensitive regions (i.e., an image sensor wafer) may be provided. At step 204, layer 150 may be formed over substrate 108. Layer 150 may be deposited using any desired techniques. Layer 150 may be formed from any desired material (e.g., silicon nitride). At step 204, layer 150 may have a uniform thickness across the entire substrate.

To form layer 150 into a desired shape, layer 150 may be etched at step 206. Masking layer 172 may be used to help etch layer 150. Layer 150 may undergo isotropic or anisotropic etching to form trenches 174. To achieve curved surfaces as shown in FIG. 8, a halftone masking layer may be used to etch layer 150. After etching is complete and layer 150 is formed in the desired shape, masking layer 172 may be removed.

After step 206 is complete, the process may continue with either step 208 or step 210. At step 208, an additional layer 148 is formed over layer 150. Layer 148 may be formed or deposited using any desired techniques. In step 208, all of layer 148 is formed in one step. Alternatively, layer 148 may be formed in two steps as shown in steps 210 and 212. At step 210, the trenches may be filled with a first portion of dielectric layer 148-1. At step 210, layer 148-1 may only fill the trenches and may not cover the portions of layer 150 in between the trenches. Also in step 210, the upper surfaces of layer 148-1 may undergo chemical mechanical planarization (CMP). At step 212, a second portion of dielectric layer 148-2 may be formed over layer 150 and the first portion of dielectric layer 148-1. In some embodiments, step 212 may be omitted from the process (i.e., the process may skip from step 210 to step 214 without forming the additional planarization layer 148-2).

After layer 148 is totally formed (i.e., after step 208 or step 212), a color filter layer 104 may be formed on layer 148 in step 214. Color filter layer 104 may be formed using any desired methods. Finally, at step 216, an additional planarization layer 146 and microlens 102 may be formed over the color filter layer. This method may be used to form optical structures of any desired shape between microlens 102 and image sensor wafer 108.

In the embodiments of FIGS. 4-7, phase detection pixel groups were described where a single microlens covered two photodiodes. These types of phase detection pixel groups may sometimes be referred to as a 2×1 or 1×2 arrangement because there are two phase detection pixels arranged consecutively in a line. However, the examples in FIGS. 4-7 of a 2×1 pixel group are merely illustrative, and any desired pixel arrangement may be used. For example, three phase detection pixels may be arranged consecutively in a line and be covered by one or more microlenses. These types of arrangements may be referred to as a 3×1 or 1×3 arrangement. In other embodiments, a 2×2 or 3×3 arrangement may be used. In general, the optical structures discussed in connection with FIGS. 4-8 may be applied to phase detection pixel groups of any desired size (i.e., n×m pixel groups).

Figure 9:
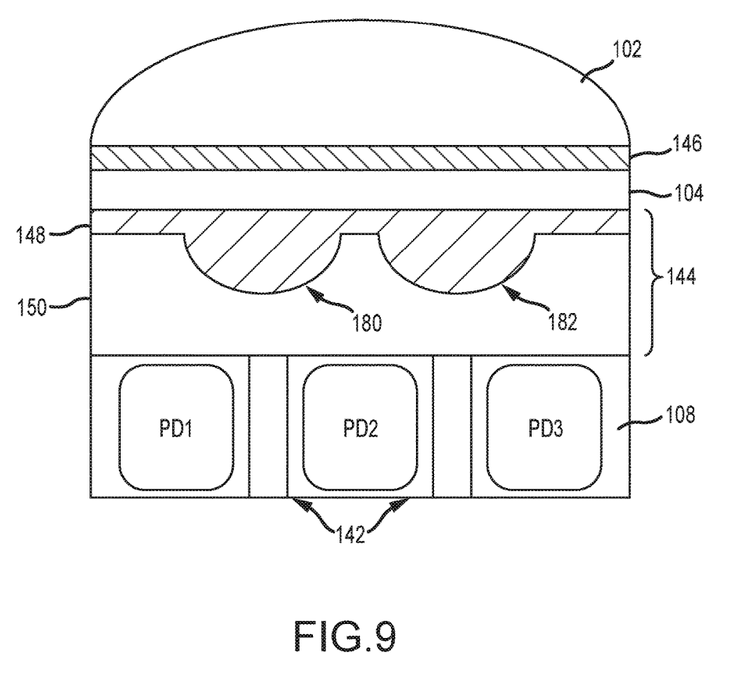
FIG. 9 is a cross-sectional side view of an illustrative 1×3 phase detection pixel group with optical structures in accordance with an embodiment of the present invention.

FIG. 9 is cross-sectional side view of a 1×3 phase detection pixel group with optical structures for redirecting light. The optical structures may include a first concave lens portion 180 and a second concave lens portion 182. The first concave lens portion 180 may help split incident light between PD1 and PD2 while the second concave lens portion 182 may help split incident light between PD2 and PD3. In FIG. 9, layer 150 may have first and second trenches formed under microlens 102. The trenches may both be filled by material of layer 148.

Optical structure 144 may be used to customize the response to incident light in many ways. In FIGS. 4-9, optical structure 144 included two layers of material with different indices of refraction. However, for additional control of incident light, optical structure 144 may include three or more layers of material.

Figure 10:
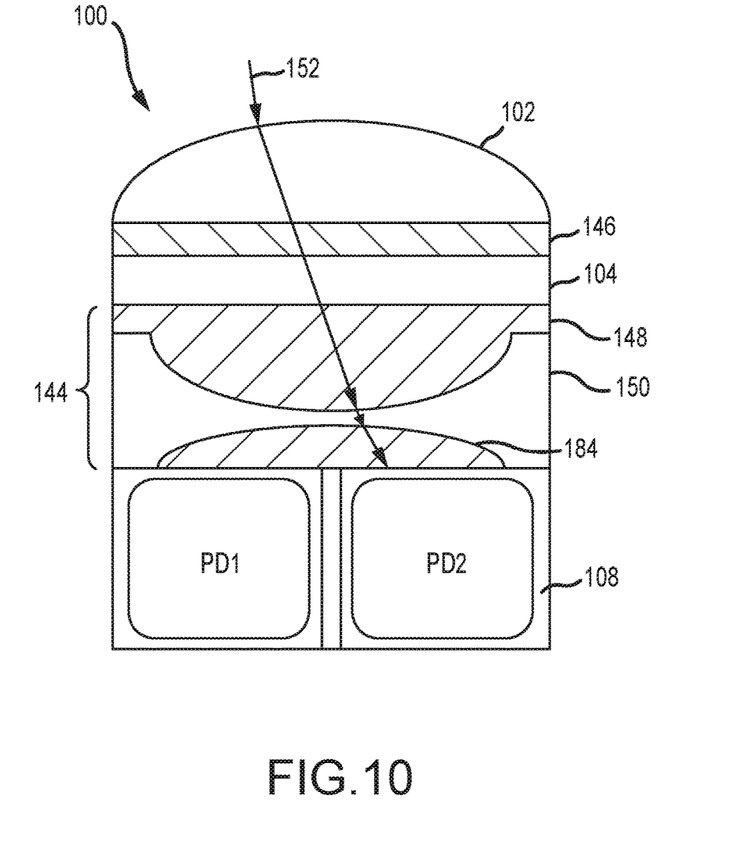
FIGS. 10 and 11 are cross-sectional side views of illustrative phase detection pixel pairs with optical structures that include three optical layers in accordance with an embodiment of the present invention.

FIG. 10 is a cross-sectional side view of a phase detection pixel pair with an optical structure 144 formed from three layers of material. In FIG. 10, layers 148 and 150 may have an interface similar to as described in connection with FIG. 4. However, optical structure 144 may also include layer 184 which forms an additional interface with layer 150.

Layer 184 may have a smaller index of refraction than layer 150. For example, layer 184 may have an index of refraction of approximately 1.45, approximately 1.5, between 1.4 and 1.5, less than 1.6, less than 1.7, between 1.3 and 1.6, between 1.4 and 1.6, between 1.45 and 1.55, between 1.0 and 1.6, or any other desired index of refraction. Layer 184 may be formed from any desired material. For example, layer 184 may be formed from silicon dioxide ($SiO_2$) or another material with an index of refraction lower than the index of refraction of layer 150. If desired, dielectric layer 184 may be formed from the same material has layer 148 or planarization layer 146. For example, dielectric layers 148 and 184 may both be formed from silicon dioxide.

The difference of indices of refraction between layers 184 and 150 may be any desired difference. For example, the difference in refractive index may be greater than 0.1, greater than 0.2, greater than 0.3, greater than 0.4, greater than 0.5, less than 1.0, less than 0.7, less than 0.5, less than 0.3, between 0.3 and 0.6, between 0.3 and 0.7, between 0.2 and 1.0, between 0.05 and 1.0, between 0.1 and 0.5, between 0.4 and 0.7, or any other desired difference. There may be a tradeoff between the difference of refractive index between layers 184 and 150 and the shape of the interface between layers 184 and 150.

The difference of indices of refraction between layers 184 and 148 may be any desired difference. For example, the difference in refractive index may be less than 0.01, less than 0.1, less than 0.2, less than 0.3, less than 0.4, less than 0.5, greater than 0.1, or any other desired difference. The indices of refraction of layers 184 and 148 may be approximately the same.

The shape of layer 184 may be customized as desired. In FIG. 10, the surface between layers 148 and layer 184 is curved in the opposite direction as the curved surface between layers 148 and 150. This will cause the separation of incident light between PD1 and PD2 to be amplified even further. In other words, when incident light passes from layer 148 to 150, the separation of incident light between PD1 and PD2 increases. When incident light passes from layer 150 to layer 184, the separation of incident light between PD1 and PD2 increases even more, as shown by incident light 152 in FIG. 10.

Figure 11:
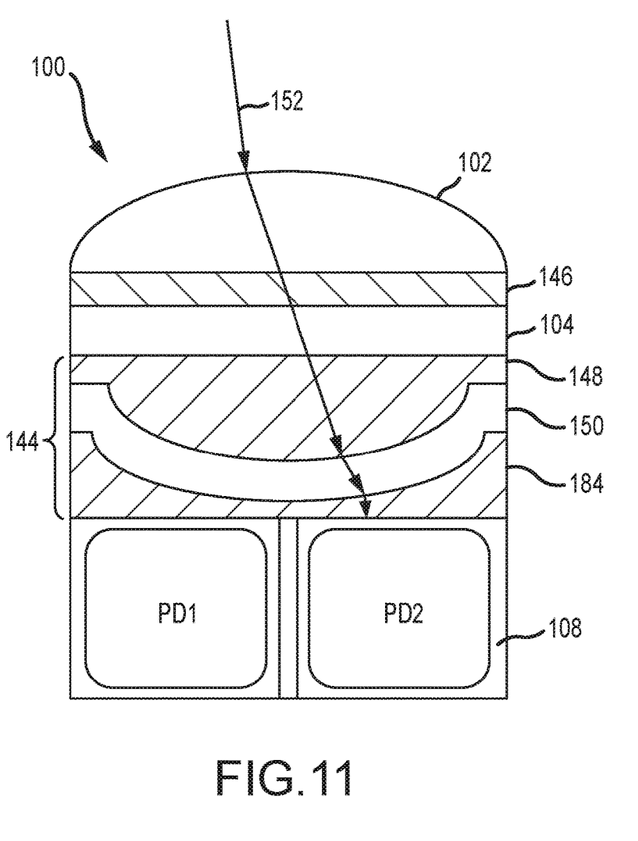

In an alternate embodiment shown in FIG. 11, layer 184 of optical structure 144 may redirect incident light to approach the upper surface of silicon substrate 108 at an angle closer to perpendicular to the upper surface of the substrate. If incident light approaches substrate 108 at too much of an angle, the light may reflect off of the substrate or not penetrate the substrate sufficiently deep. To minimize this problem, layer 184 in FIG. 11 helps redirect the incident light so that the incident light approaches the substrate at an angle closer to perpendicular to the upper surface of the substrate, as shown by incident light 152 in FIG. 11. As a whole, therefore, the optical structure improves the separation of incident light between PD1 and PD2 while still ensuring an appropriate angle of incidence when the light reaches substrate 108.

Several of the aforementioned embodiments describe examples where optical structures 144 in phase detection pixel pair 100 include layers of different indices of refraction. The layers with different indices of refraction combine to redirect incident light and achieve the desired effect for the pixel pair. It should be noted, however, that the example of optical structure 144 as including layers with different indices of refraction is merely illustrative. Optical structures 144 may use other methods to redirect light.

Figure 12:
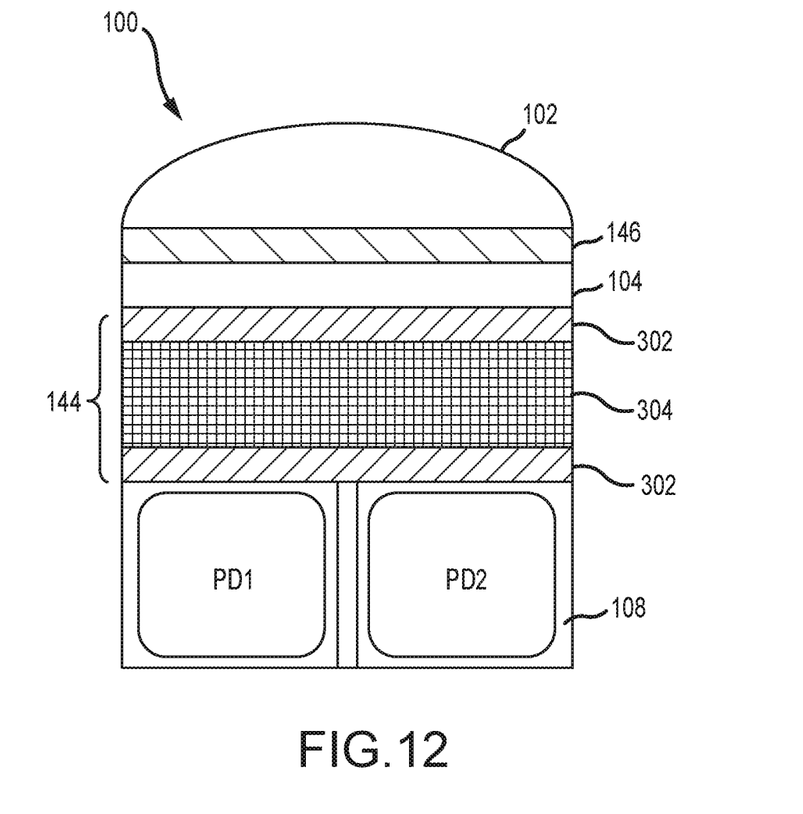
FIG. 12 is a cross-sectional side view of an illustrative phase detection pixel pair with optical structures formed form an optical material in accordance with an embodiment of the present invention.

FIG. 12 shows an illustrative example where optical structures 144 in phase detection pixel pair 100 include optical material 304 (sometimes referred to as optical structure 304) between planarization layers 302. Planarization layers 302 may be formed from silicon dioxide. Planarization layers 302 may have the same characteristics as layer 148 in FIGS. 4-7. Optical material 304 may include grating, nanomaterial, or any other desired material or structure that can control incident light beams.

In various embodiments, an image sensor may include a substrate, at least first and second photodiodes formed in the substrate, a microlens that covers the at least first and second photodiodes, a color filter layer interposed between the microlens and the at least first and second photodiodes, and an optical structure that is interposed between the color filter layer and the at least first and second photodiodes. The optical structure may redirect incident light between the color filter layer and the at least first and second photodiodes.

The optical structure may include first and second layers with different indices of refraction. The first layer may have a first index of refraction between 1.3 and 1.6 and the second layer may have a second index of refraction between 1.7 and 2.0. The first layer may have a curved surface that curves towards the substrate. The image sensor may also include a planarization layer that is interposed between the color filter layer and the microlens. The planarization and the first layer may be formed from the same material. The first layer may be interposed between the color filter layer and the second layer and the first layer may have a lower index of refraction than the second layer. The first layer may include silicon dioxide and the second layer may include silicon nitride. The optical structure may include a third layer that is interposed between the second layer and the substrate and the third layer may have a lower index of refraction than the second layer. The second layer may have first and second opposing surfaces, the first surface may be adjacent the first layer, and the second surface may be adjacent the third layer. The first surface may curve towards the substrate and the second surface may curve away from the substrate. The first surface may curve towards the substrate and the second surface may curve towards the substrate. The first and third layers may both be formed from silicon dioxide.

In various embodiments, an image sensor may include a substrate, first and second photosensitive regions formed in the substrate, a microlens that covers the first and second photosensitive regions, a color filter layer interposed between the microlens and the first and second photosensitive regions, a first optical layer with a first index of refraction that is interposed between the microlens and the first and second photosensitive regions, and a second optical layer with a second index of refraction that is interposed between the first optical layer and the first and second photosensitive regions. The second index of refraction may be greater than the first index of refraction.

The first and second optical layers may be in direct contact at an interface. The interface may extend over all of the first and second photosensitive regions. The image sensor may also include a third optical layer with a third index of refraction. The third optical layer may be interposed between the second optical layer and the first and second photosensitive regions and the second index of refraction may be greater than the third index of refraction. The first and second optical layers may be in direct contact at a first interface and the second and third optical layers may be in direct contact at a second interface. The first interface and the second interface may curve in opposite directions or the same direction.

In various embodiments, a method may include forming a first dielectric layer over a substrate that has a plurality of photodiodes, etching a plurality of trenches in the first dielectric layer with each trench of the plurality of trenches being formed over at least two photodiodes of the plurality of photodiodes, forming a second dielectric layer over the first dielectric layer such that the second dielectric layer fills the trenches of the first dielectric layer, forming a color filter layer over the second dielectric layer, and forming a plurality of microlenses over the color filter layer. The first and second dielectric layers may have different indices of refraction and each microlens of the plurality of microlenses may cover at least two photodiodes of the plurality to photodiodes. The first dielectric layer may have a greater index of refraction than the second dielectric layer.

The foregoing is merely illustrative of the principles of this invention and various modifications can be made by those skilled in the art. The foregoing embodiments may be implemented individually or in any combination.

What is claimed is:

1. An image sensor comprising:
   a substrate;
   at least first and second photodiodes formed in the substrate;
   a microlens that covers the at least first and second photodiodes;
   a color filter layer interposed between the microlens and the at least first and second photodiodes; and
   an optical structure that is interposed between the color filter layer and the at least first and second photodiodes, wherein the optical structure redirects incident light between the color filter layer and the at least first and second photodiodes, wherein the optical structure comprises first and second layers with different indices of refraction, and wherein the first layer has a curved surface that curves towards the substrate.

2. The image sensor defined in claim 1, wherein the first layer has a first index of refraction between 1.3 and 1.6 and wherein the second layer has a second index of refraction between 1.7 and 2.0.

3. The image sensor defined in claim 1, further comprising a planarization layer that is interposed between the color filter layer and the microlens.

4. The image sensor defined in claim 3, wherein the planarization layer and the first layer are formed from the same material.

5. The image sensor defined in claim 1, wherein the first layer is interposed between the color filter layer and the second layer and wherein the first layer has a lower index of refraction than the second layer.

6. The image sensor defined in claim 5, wherein the first layer comprises silicon dioxide and wherein the second layer comprises silicon nitride.

7. The image sensor defined in claim 5, wherein the optical structure comprises a third layer that is interposed between the second layer and the substrate and wherein the third layer has a lower index of refraction than the second layer.

8. The image sensor defined in claim 7, wherein the second layer has first and second opposing surfaces, wherein the first surface is adjacent the first layer, wherein the second surface is adjacent the third layer, wherein the first surface curves towards the substrate, and wherein the second surface curves away from the substrate.

9. The image sensor defined in claim 7, wherein the second layer has first and second opposing surfaces, wherein the first surface is adjacent the first layer, wherein the second surface is adjacent the third layer, wherein the first surface curves towards the substrate, and wherein the second surface curves towards the substrate.

10. The image sensor defined in claim 7, wherein the first and third layers are both formed from silicon dioxide.

11. An image sensor comprising:
    a substrate;
    first and second photosensitive regions formed in the substrate;
    a microlens that covers the first and second photosensitive regions;
    a color filter layer interposed between the microlens and the first and second photosensitive regions;
    a first optical layer with a first index of refraction, wherein the first optical layer is interposed between the microlens and the first and second photosensitive regions; and
    a second optical layer with a second index of refraction, wherein the second optical layer is interposed between the first optical layer and the first and second photosensitive regions and wherein the second index of refraction is greater than the first index of refraction; and
    a third optical layer that is interposed between the second optical layer and the first and second photosensitive regions.

12. The image sensor defined in claim 11, wherein the first and second optical layers are in direct contact at an interface.

13. The image sensor defined in claim 12, wherein the interface extends over all of the first and second photosensitive regions.

14. The image sensor defined in claim 11, wherein the third optical layer has a third index of refraction and wherein the second index of refraction is greater than the third index of refraction.

15. The image sensor defined in claim 14, wherein the first and second optical layers are in direct contact at a first interface, wherein the second and third optical layers are in direct contact at a second interface and wherein the first interface and the second interface curve in opposite directions.

16. The image sensor defined in claim 14, wherein the first and second optical layers are in direct contact at a first interface, wherein the second and third optical layers are in direct contact at a second interface, and wherein the first interface and the second interface curve in the same direction.

17. The image sensor defined in claim 11, further comprising a planarization layer that is interposed between the color filter layer and the microlens, wherein the planarization layer and the first optical layer are formed from the same material.

18. A method comprising:
   forming a first dielectric layer over a substrate, wherein the substrate has a plurality of photodiodes;
   etching a plurality of trenches in the first dielectric layer, wherein each trench of the plurality of trenches is formed over at least two photodiodes of the plurality of photodiodes;
   forming a second dielectric layer over the first dielectric layer, wherein the second dielectric layer fills the trenches of the first dielectric layer and wherein the first and second dielectric layers have different indices of refraction;
   forming a color filter layer over the second dielectric layer; and
   forming a plurality of microlenses over the color filter layer, wherein each microlens of the plurality of microlenses covers at least two photodiodes of the plurality to photodiodes.

19. The method defined in claim 18, wherein the first dielectric layer has a greater index of refraction than the second dielectric layer.

* * * * *